(12) United States Patent
Vazhenin et al.

(10) Patent No.: US 9,503,219 B2
(45) Date of Patent: Nov. 22, 2016

(54) METHOD AND DEVICE FOR MEASURING THE CURRENT SIGNAL-TO-NOISE RATIO WHEN DECODING LDPC CODES

(71) Applicant: Topcon Positioning Systems, Inc., Livermore, CA (US)

(72) Inventors: Nikolay Vazhenin, Moscow (RU); Andrey Veitsel, Moscow (RU); Ivan Kirianov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 0 days.

(21) Appl. No.: 14/331,175

(22) Filed: Jul. 14, 2014

(65) Prior Publication Data

US 2015/0117505 A1    Apr. 30, 2015

(30) Foreign Application Priority Data

Oct. 28, 2013    (RU) ............................... 2013/147873

(51) Int. Cl.
| | |
|---|---|
| *H03M 13/00* | (2006.01) |
| *H04L 1/00* | (2006.01) |
| *H04L 1/20* | (2006.01) |
| *H03M 13/11* | (2006.01) |
| *H04B 17/336* | (2015.01) |

(52) U.S. Cl.
CPC ........ *H04L 1/0063* (2013.01); *H03M 13/1111* (2013.01); *H03M 13/612* (2013.01); *H04L 1/005* (2013.01); *H04L 1/0057* (2013.01); *H04L 1/20* (2013.01); *H04B 17/336* (2015.01)

(58) Field of Classification Search
CPC ........... H04L 1/1027; H03M 13/1105; H04B 1/1027
See application file for complete search history.

(56) References Cited

U.S. PATENT DOCUMENTS

| | | | |
|---|---|---|---|
| 6,028,894 A | 2/2000 | Oishi et al. | |
| 6,480,315 B1 | 11/2002 | Brown | |
| 6,717,976 B1 | 4/2004 | Shen | |
| 6,760,370 B2 | 7/2004 | Li et al. | |
| 7,190,741 B1 | 3/2007 | Manning | |
| 7,362,801 B2 | 4/2008 | Goel | |
| 7,363,801 B2 | 4/2008 | Tsuchihashi et al. | |
| 7,414,581 B2 | 8/2008 | Vallot | |
| 7,484,136 B2 | 1/2009 | Qiu | |

(Continued)

FOREIGN PATENT DOCUMENTS

| | | |
|---|---|---|
| RU | 2332676 C1 | 8/2008 |
| RU | 2354981 C1 | 5/2009 |

(Continued)

*Primary Examiner* — Esaw Abraham
(74) *Attorney, Agent, or Firm* — Chiesa Shahinian & Giantomasi PC

(57) ABSTRACT

A method for measuring a signal-to-noise ratio when decoding Low Density Parity Check (LDPC) codes is provided. The method includes receiving from an input of a demodulator an input code word with "strong" or "weak" solutions, decoding the input code word in a LDPC decoder using a predetermined dependence of a mean number of iterations on the signal-to-noise ratio, recording a number of iterations performed during the decoding of the input code word, averaging derived values of the number of iterations for a specified time interval, estimating a signal-to-noise ratio based on averaged derived values of the number of iterations and based on the predetermined dependence of the mean number of iterations on the signal-to-noise ratio, and generating an output decoded code word.

6 Claims, 10 Drawing Sheets

(56) References Cited

U.S. PATENT DOCUMENTS

| | | |
|---|---|---|
| 7,577,100 B2 | 8/2009 | Pollmann et al. |
| 7,580,469 B2 * | 8/2009 | Yonesi ............... H03M 13/1102 |
| | | 375/262 |
| 7,729,663 B2 | 6/2010 | Qiu et al. |
| 7,770,090 B1 * | 8/2010 | Kons ................. H03M 13/1137 |
| | | 714/780 |
| 7,773,681 B2 | 8/2010 | Koo et al. |
| 7,805,653 B2 * | 9/2010 | Uchida ................ D21F 1/0027 |
| | | 714/752 |
| 7,864,903 B2 * | 1/2011 | Murakami ........... H04B 7/0413 |
| | | 375/219 |
| 8,046,658 B2 | 10/2011 | Heinrich et al. |
| 8,194,558 B2 | 6/2012 | Choi et al. |
| 8,199,558 B2 | 6/2012 | Khoury et al. |
| 8,279,914 B2 | 10/2012 | Tseng |
| 8,508,981 B2 | 8/2013 | Khoury et al. |
| 8,555,131 B2 * | 10/2013 | Rault ................ H03M 13/1128 |
| | | 713/324 |
| 8,656,243 B2 * | 2/2014 | Wehinger .............. H04L 1/1812 |
| | | 375/232 |
| 8,953,696 B2 * | 2/2015 | Stoye .................... H04L 1/0045 |
| | | 375/260 |
| 2010/0054319 A1 | 3/2010 | Lee |
| 2011/0188561 A1 | 8/2011 | Mizrahi et al. |
| 2011/0307767 A1 | 12/2011 | Kelin et al. |
| 2012/0131415 A1 | 5/2012 | Park et al. |

FOREIGN PATENT DOCUMENTS

| | | |
|---|---|---|
| RU | 2006129316 C2 | 9/2009 |
| RU | 2434325 C1 | 11/2011 |
| RU | 2446448 C1 | 3/2012 |
| RU | 2461052 C2 | 9/2012 |
| RU | 2497294 C2 | 10/2013 |
| RU | 2518410 C2 | 6/2014 |
| WO | 2013134071 A1 | 9/2013 |

* cited by examiner

METHOD AND DEVICE FOR MEASURING THE CURRENT SIGNAL-TO-NOISE RATIO WHEN DECODING LDPC CODES

RELATED APPLICATIONS

This application claims priority to Russian Federation Patent Application No. 2013/147873, filed on Oct. 28, 2013, which is incorporated herein by reference in its entirety.

TECHNICAL FIELD

The technical field pertains to digital radio communication systems, transmission systems for differential corrections and almanacs in radio navigation, etc. The present disclosure pertains to a method and systems for receiving and processing signals and estimating the current signal-to-noise ratio at the input of a receiver.

BACKGROUND ART

The problem of estimating the current signal-to-noise ratio in a radio channel is of timely interest for radio communication systems and consequently has long been a subject of engineering development. There are known methods and devices for estimating the current value of signal-to-noise ratio, described, for instance, in U.S. Pat. Nos. 6,028,894; 6,480,315; 6,717,976; 6,760,370; 7,190,741; 7,414,581; 7,484,136; 7,577,100; 7,729,663; 7,362,801; 7,773,681; 8,194,558; and 8,279,914 and in U.S. Patent Application Publications 2010/0054319; 2011/0188561; 2011/0307767; and 2012/0131415.

Similar technical solutions are presented in Russian Federation Patents 2,332,676; 2,354,981; 2,434,325; 2,446,448 and in Russian Federation patent application 2006129316. U.S. Patent Application Publication No. 2011/0188561 discusses a method and device for estimating the signal-to-noise ratio comprising a demodulator, a decoder of error-correcting codes, and a signal-to-noise ratio estimating unit. The estimate of the current signal-to-noise ratio is based on measuring the signal level and noise level, carried out based on processing the received mixture of signal and noise. However, using this technical solution at small signal-to-noise ratios is difficult. In U.S. Pat. No. 6,760,370, a method for estimating the signal-to-noise ratio that works effectively at low signal-to-noise ratios is described. This method is likewise based on processing the input mixture of signal and noise. The method and device for estimating signal-to-noise ratio, noise power and signal strength, as described in U.S. Pat. No. 7,773,681 and U.S. Patent Application Publication No. 2010/0054319, generate these estimates based on processing the received mixture of signal and noise. A method for determining the signal-to-noise ratio for signals with QAM modulation presented in U.S. Pat. No. 7,363,801 is based on the analysis of statistical characteristics of the complex envelope of the incoming signal. In the device for measuring the signal-to-noise ratio according to U.S. Pat. No. 6,028,894 which comprises an averaging unit and a signal-to-noise ratio estimating unit, measurements are carried out based on processing a signal from a quadrature mixer output. The method for measuring the signal-to-noise ratio featured in U.S. Pat. No. 8,194,558 proposes to estimate the signal-to-noise ratio based on processing of the received signal. Here, the available decoder of error-correcting codes does not take part in estimating the signal-to-noise ratio. Russian Federation Patent No. 2,354,981 describes a method for measuring low signal-to-noise ratios and a device for its implementation. This technical solution comprises narrow-band filtering of the received signal, switching the high-frequency component phase of this signal, extracting the out-of-band components, and determining their power relative to total signal power. A method and device for measuring the signal-to-noise ratio when decoding convolutional codes are also described in Russian Federation Patent Nos. 2,434,325 and 2,446,448 and include a Viterbi decoder, units to estimate current decoding parameters, and a signal-to-noise ratio estimating unit. However, a drawback of the listed technical solutions is that they are only applicable for estimating the signal-to-noise ratio when decoding convolutional codes. The purpose of the claimed solution is to eliminate drawbacks of known technical solutions.

SUMMARY OF THE INVENTION

The claimed technical solution is directed to obtaining an estimate of the current signal-to-noise ratio at the input of a receiving unit in the process of decoding Low Density Parity Check (LDPC) codes, i.e., codes with low density of parity checking, which are also called Gallagher codes. Currently, these codes are widely used, since along with turbo codes they make it possible to come close to the Shannon limit.

The technical result of using the described method and systems is improving interference suppression of information transfer systems due to the use of an estimate of the current signal-to-noise ratio during demodulation and decoding.

The proposed method and system are based on the existing dependence of the law of distribution and the average number of iterations, and on the law of distribution and the average weight of the syndrome when decoding a code word on the signal-to-noise ratio at the input of a receiver (demodulator). One of the features of the proposed technical solution is the capability of determining small values of the signal-to-noise ratio. The claimed purpose is achieved by using and statistical processing of the number of iterations and/or of the weight of the syndrome, obtained from the LDPC decoder when decoding each code word.

The known methods for estimating the current signal-to-noise ratio are characterized by the fact that an input code word with the "strong" or "weak" solutions is obtained from the output of the demodulator, the input code word is decoded in the decoder, the output decoded code word is generated, if there is the next code word at the input of the decoder, it is received and processed, otherwise, the decoding is ended.

In a first embodiment, when decoding LDPC codes: for a specified type of the LDPC decoder, the dependence of the average number of iterations, when decoding an input code word on the signal-to-noise ratio, is predetermined experimentally or theoretically. When decoding each input code word, the number of the iterations performed during decoding is recorded. The values obtained for the number of iterations are averaged for a specified time interval. Based on this averaged value of the number of iterations and on the earlier-derived dependence of the average number of iterations, when decoding an input code word on the signal-to-noise ratio, an estimate of the current signal-to-noise ratio is derived.

In a second embodiment, for a specified type of the LDPC decoder, the dependence of the average weight of the syndrome, when decoding an input code word on the signal-to-noise ratio, is predetermined experimentally or theoretically. When decoding each input code word for a specified number of iterations of decoding, the weight of the syndrome is recorded and the derived values of the weight of the syndrome are averaged for a specified time interval. Based on this averaged value of the weight of the syndrome and on the earlier-derived dependence of the average weight of the syndrome, when decoding an input code word on the signal-to-noise ratio, an estimate of the current signal-to-noise ratio is derived.

In the third embodiment, for a specified type of the LDPC decoder, the dependence of the average number of iterations, when decoding an input code word, as well as the dependence of the average weight of the syndrome for a specified number of iterations when decoding an input code word on the signal-to-noise ratio, are predetermined experimentally or theoretically. When decoding each input code word, the number of iterations performed during decoding, and the weight of the syndrome for a specified number of iterations, are recorded. The derived values of the number of iterations and of the weight of the syndrome are averaged for a specified time interval. Based on these averaged values of the number of iterations and the weight of the syndrome, and on the earlier-derived dependence of the average number of iterations when decoding an input code word on the signal-to-noise ratio, as well as the dependence of the weight of the syndrome for a specified number of iterations on the signal-to-noise ratio, estimates of the current signal-to-noise ratio are derived for each measurement channel. Using the estimates for the signal-to-noise ratio in each measurement channel, the final estimate is made for the current signal-to-noise ratio, for instance, by weighted summation and normalization.

In the fourth embodiment, for a specified type of the LDPC decoder, the dependence of the average number of iterations, when decoding an input code word on the signal-to-noise ratio, is predetermined experimentally or theoretically. When decoding each input code word, the number of iterations performed during decoding is recorded. A histogram of distribution of the number of iterations for a specified time interval is constructed. Based on the comparison of the histogram of distribution of the number of iterations and based on the earlier-derived dependence of the distribution of the number of iterations, when decoding input code words on the signal-to-noise ratio, an estimate of the current signal-to-noise ratio is derived.

In the fifth embodiment, for a specified type of the LDPC decoder, the dependence of the law of distribution of the weight of the syndrome, when decoding input code words on the signal-to-noise ratio, is predetermined experimentally or theoretically for a specified number of iterations, when decoding each input code word for a specified number of iterations of decoding, the weight of the syndrome is recorded, a histogram of distribution of the weight of the syndrome for a specified time interval is constructed, based on the comparison of this histogram of distribution of the weight of the syndrome and on the earlier-derived dependence of the distribution of the weight of the syndrome for a specified number of iterations when decoding input code words, on the signal-to-noise ratio an estimate of the current signal-to-noise ratio is derived.

In addition, in the sixth embodiment of the proposed method for measuring the current signal-to-noise ratio when decoding LDPC codes: for a specified type of the LDPC decoder, the dependence of the law of distribution of the number of iterations when decoding an input code word, as well as the dependence of the law of distribution of the weight of the syndrome for a specified number of iterations when decoding input code words, on the signal-to-noise ratio are predetermined experimentally or theoretically, when decoding each input code word, the number of iterations performed during decoding and the weight of the syndrome for a specified number of iterations are recorded, a histogram of distribution of the number of iterations for a specified time interval is constructed, based on the comparison of this histogram of distribution of the number of iterations and the earlier-derived dependence of the law of distribution of the number of iterations when decoding an input code word on the signal-to-noise ratio, an estimate of the current signal-to-noise ratio is derived, a histogram of distribution of the weight of the syndrome for a specified time interval is constructed, based on the comparison of this histogram of distribution of the weight of the syndrome and on the earlier-derived dependence of the law of distribution function of the weight of the syndrome when decoding input code words on the signal-to-noise ratio, an estimate of the current signal-to-noise ratio is derived, using the estimates for the signal-to-noise ratio in each measurement channel, the final estimate is made for the current signal-to-noise ratio, for instance, by weighted summation and normalization.

The known instruments for measuring the current signal-to-noise ratio comprise the decoder (1), the input of which is the input of the device and the first output of which is the first output of the device, and the signal-to-noise ratio estimating unit (4), the output of which is the second output of the device.

In the first embodiment of the device for measuring the current signal-to-noise ratio, the LDPC decoder is used, and also introduced are a synchronization unit (2), the input of which is connected to the device input, and the outputs of which are used to synchronize the operation of the components of the device, and the counter (3) the input of which is connected to the second output of the LDPC decoder and the output of which is connected to the input of the signal-to-noise ratio estimating unit (4).

Another embodiment of this device is the case when the signal-to-noise ratio estimating unit (4) is made in the form of the series-connected low-frequency filter (41) and non-linear component (42), the amplitude characteristic of which is the inverse relationship between the average number of iterations when decoding an input code word and the signal-to-noise ratio, derived for this type of the LDPC decoder.

Here, the signal-to-noise ratio estimating unit (4) is made in the form of the series-connected histogram unit (43), correlation unit (44), and unit for finding the argument of the maximum (45), wherein the input of the histogram unit (43) is the input of the signal-to-noise ratio estimating unit (4), and the output of the unit for finding the argument of the maximum (45) is the output of the signal-to-noise ratio estimating unit (4).

In turn, the unit for finding the argument of the maximum (45) is made in the form of the series-connected approximation unit (451) and unit for calculation of the abscissa of the maximum (452), wherein the inputs of the approximation unit (451) are the inputs of, and the output of the unit for calculation of the abscissa of the maximum (452) is the output of the unit for finding the argument of the maximum (45).

In the second embodiment of the device for measuring the current signal-to-noise ratio, the LDPC decoder is used, and also introduced are the synchronization unit (2), the input of which is connected to the device input and the outputs of which are used to synchronize the operation of components of the device, the unit for calculating the weight of the syndrome (5), wherein the input of the unit for calculating the weight of the syndrome (5) is connected to the third output of the LDPC decoder and the outputs of the unit for estimating the weight of the syndrome (5) are connected to the corresponding inputs of the signal-to-noise ratio estimating unit (6), the output of which is the second output of the device.

Here, the unit for calculating the weight of the syndrome (5) is made in the form of the series-connected adder (51), switch (52), memory components unit (53), and keys unit (54), wherein the input of the adder (51) is the input of, and the outputs from the keys unit (54) are the outputs of the unit for calculating the weight of the syndrome (5).

Also, the signal-to-noise ratio estimating unit (6) may be made in the form of the series-connected set of low-pass filters (61), set of non-linear components (62), first adder (63) and divider (66), as well as the series-connected set of clippers (64) and second adder (65), wherein the inputs of the set of clippers (64) are connected to the corresponding outputs of the set of non-linear components (62) and the output of the second adder (65) is connected to the second input of the divider (66), the inputs of the set of low-pass filters (61) are the inputs of, and the output of the divider (66) is the output of the signal-to-noise ratio estimating unit (6), and the amplitude characteristic of each of the non-linear components (62) is the inverse relationship between the average weight of the syndrome when decoding the input code word for a specified number of iterations of decoding and the signal-to-noise ratio, derived for this type of the LDPC decoder.

In addition, the signal-to-noise ratio estimating unit (6) can be made in the form of the series-connected set of histogram units (611), set of correlation units (612), and set of units for finding the argument of the maximum (613), first adder (63) and divider (66), as well as the series-connected set of clippers (641) and second adder (65), wherein the inputs of the set of clippers (641) are connected to the corresponding outputs of the units for finding the argument of the maximum (613) and the output of the second adder (65) is connected to the second input of the divider (66), where the inputs of the set of histogram units (611) are the inputs of, and the output of the divider (66) is the output of the signal-to-noise ratio estimating unit (6).

Also, each unit for finding the argument of the maximum (613) can be made in the form of the series-connected approximation unit (451) and unit for calculation of the abscissa of the maximum (452), wherein the inputs of the approximation unit (451) are the inputs of, and the output of the unit for calculation of the abscissa of the maximum (452) is the output of each unit for finding the argument of the maximum (613).

The next embodiment of the device for measuring the current signal-to-noise ratio is characterized by the fact that the LDPC decoder is used, and also introduced are the synchronization unit (2) the input of which is connected to the device input and the outputs of which are used to synchronize operation of components of the device, the counter (3) the input of which is connected to the second output of the LDPC decoder and the output of which is connected to the input of the first signal-to-noise ratio estimating unit (4), the series-connected unit for evaluating the weight of the syndrome (5) the input of which is connected to the third output of the LDPC decoder, and the second signal-to-noise ratio estimating unit (6), as well as the series-connected weighted adder (7) and normalization unit (8), wherein the first input of the weighted adder (7) is connected to the output of the first signal-to-noise ratio estimating unit (4), the second input is connected to the output of the second signal-to-noise ratio estimating unit (6), and the output of the normalization unit is the device output.

Here, the signal-to-noise ratio estimating unit (4) can be made in the form of the series-connected low-pass filter (41) and non-linear component (42), the amplitude characteristic of which is the inverse relationship between the average number of iterations when decoding an input code word and the signal-to-noise ratio, derived for this type of the LDPC decoder.

In addition, the signal-to-noise ratio estimating unit (4) can be made in the form of the series-connected histogram unit (43), correlation unit (44), and the unit for finding the argument of the maximum (45), wherein the input of the histogram unit (43) is an input of the signal-to-noise ratio estimating unit (4), and the output of the unit for finding the argument of the maximum (45) is the output of the signal-to-noise ratio estimating unit (4).

Here, the unit for finding the argument of the maximum (45) can be made in the form of the series-connected approximation unit (451) and unit for calculation of the abscissa of the maximum (452), wherein the inputs of the approximation unit (451) are the inputs of, and the output of the unit for calculation of the abscissa of the maximum (452) is the output of the unit for finding the argument of the maximum (45).

Also, the unit for estimating the weight of the syndrome (5) can be made in the form of the series-connected adder (51), switch (52), memory components unit (53), and keys unit (54), wherein the input of the adder (51) is an input of, and the outputs of the keys unit (54) are the outputs of the unit for estimating the weight of the syndrome (5).

The signal-to-noise ratio estimating unit (6) can be made in the form of the series-connected set of low-pass filters (61), set of non-linear components (62), first adder (63) and divider (66), as well as the series-connected set of clippers (64) and second adder (65), wherein the inputs of the set of clippers (64) are connected to the corresponding outputs of the set of non-linear components (62), and the output of the second adder (65) is connected to the second input of the divider (66), and the inputs of the set of low-pass filters (61) are the inputs of, and the output of the divider (66) the output of the signal-to-noise ratio estimating unit (6), and the amplitude characteristic of each non-linear component (62) is the inverse relationship between the average weight of the syndrome when decoding an input code word for a specified number of iterations of decoding and the signal-to-noise ratio, derived for this type of the LDPC decoder.

In addition, the signal-to-noise ratio estimating unit (6) can be made in the form of the series-connected set of histogram units (611), set of correlation units (612) and set of units for finding the argument of the maximum (613), first adder (63) and divider (66), as well as the series-connected set of clippers (641) and second adder (65), wherein the inputs of the set of clippers (641) are connected to the corresponding outputs of the set of units for finding the argument of the maximum (613), and the output of the second adder (65) is connected to the second input of the divider (66), wherein the inputs of the set of histogram units (611) are the inputs of, and the output of the divider (66) is the output of the signal-to-noise ratio estimating unit (6).

Here, each unit for finding the argument of the maximum (613) is made in the form of the series-connected approximation unit (451) and unit for calculating the abscissa of the maximum (452), wherein the inputs of the approximation unit (451) are the inputs of, and the output of the unit for calculating the abscissa of the maximum (452) is the output of the unit for finding the argument of the maximum (613).

DETAILED DESCRIPTION

Figure 1:
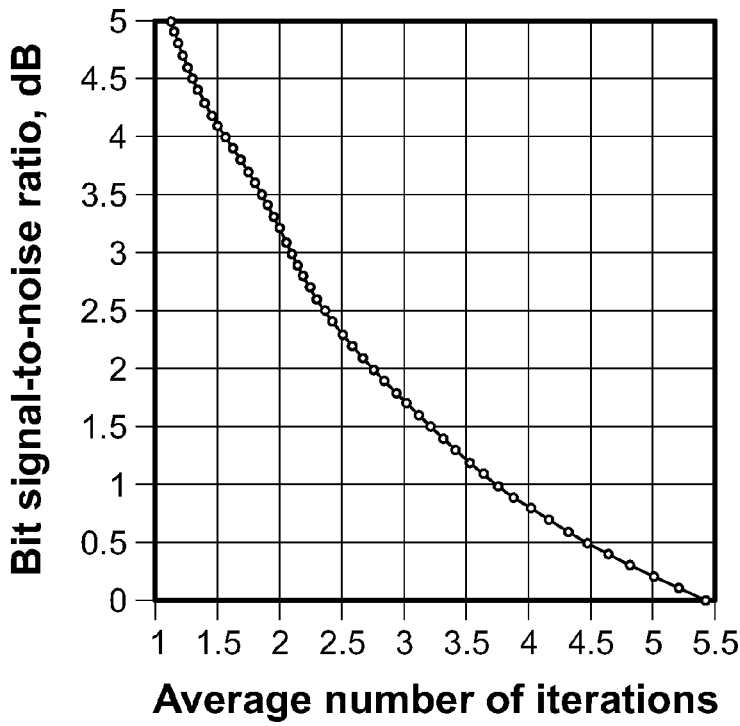
FIG. 1 contains an example of the functional interrelation of the average number of iterations when decoding a code word, and the signal-to-noise ratio.
Figure 2:
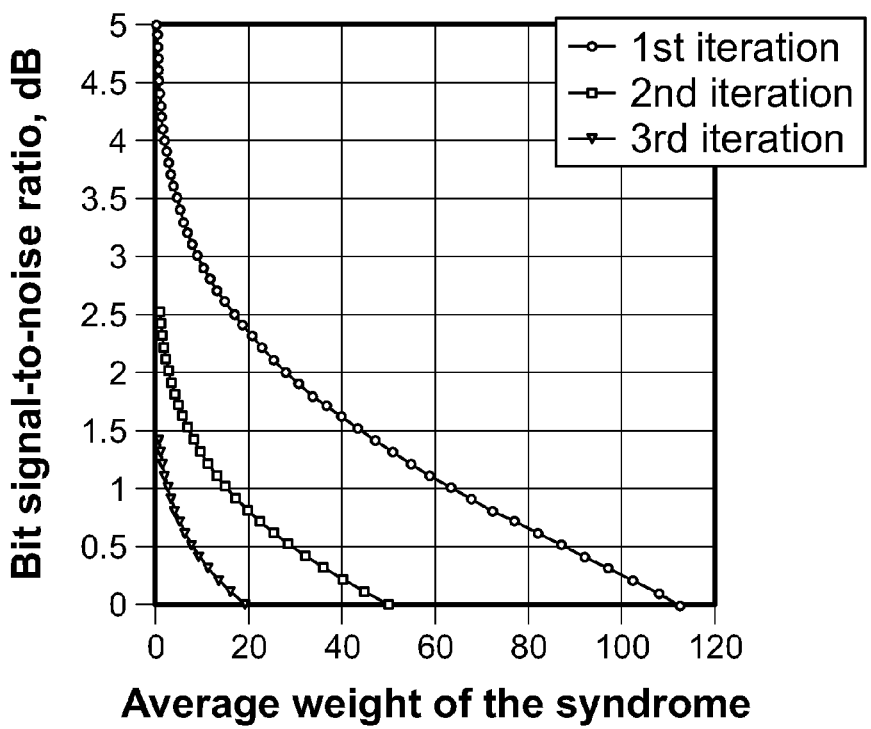
FIG. 2 shows an example of the functional interrelation of the average weight of the syndrome and the signal-to-noise ratio.

The first embodiment of the method for measuring the current signal-to-noise ratio when decoding LDPC codes comprises the following operations: for a specified type of the LDPC decoder, the dependence of the average number of iterations when decoding an input code word on the signal-to-noise ratio is predetermined experimentally or theoretically (FIG. 1 shows an example of such dependence, obtained by simulation modeling). An input code word with "strong" or "weak" solutions is obtained from the output of the demodulator, the input code word is decoded in the LDPC decoder, an output decoded code word, which arrives at the first output of the LDPC decoder, is generated, when decoding each input code word, the number of iterations performed during the process of decoding is recorded, the derived values of the number of iterations are averaged for the specified time interval. Based on this averaged number of iterations and the earlier-derived dependence of the number of iterations when decoding an input code word on the signal-to-noise ratio, an estimate of the current signal-to-noise ratio is derived. When there is the next code word at input of the decoder, it is received and processed, otherwise, the decoding is ended. The second embodiment of the method for measuring the current signal-to-noise ratio when decoding LDPC codes comprises the following operations: for a specified type of the LDPC decoder, the dependence of the average weight of the syndrome when decoding an input code word on the signal-to-noise ratio, is predetermined experimentally or theoretically (FIG. 2 shows an example of such dependence, obtained by simulation modeling). An input code word with "strong" or "weak" solutions is obtained from the output of the demodulator, the input code word is decoded in the LDPS decoder. The output code word is generated at the output of the decoder 1. When decoding each input code word, the weight of the syndrome for a specified number of iterations is recorded. For each specified number of iterations, the derived values for the weight of the syndrome are averaged for the specified time interval. Based on this averaged weight of the syndrome and the earlier-derived dependence of the average weight of the syndrome when decoding an input code word on the signal-to-noise ratio, an estimate of the current signal-to-noise ratio is derived. If there is the next code word at input of the decoder, it is received and processed otherwise, the decoding is ended.

The third embodiment of the method for measuring the current signal-to-noise ratio when decoding LDPC codes comprises the following operations: for a specified type of the LDPC decoder, the dependence of the average number of iterations when decoding an input code word on the signal-to-noise ratio, as well as the dependence of the average weight of the syndrome for a specified number of iterations when decoding an input code word on the signal-to-noise ratio are predetermined experimentally or theoretically. An input code word with "strong" or "weak" solutions is obtained from the output of the demodulator. The input code word is decoded in the decoder. An output code word is generated. When decoding each input code word for a specified number of iterations, the number of iterations performed during decoding and the weight of the syndrome are recorded.

For each specified number of iterations, the obtained values of the number of iterations and the weight of the syndrome are averaged for the specified time interval. Based on these averaged values of the number of iterations and the weight of the syndrome, and using the earlier-derived dependences of the average number of iterations when decoding an input code word and the average weight of the syndrome for a specified number of iterations on the signal-to-noise ratio, estimates of the current signal-to-noise ratio are derived for each measurement channel.

Using the estimates of the signal-to-noise ratio in each measurement channel, the final estimate of the current signal-to-noise ratio is generated, for instance, by weighted summation and normalization. When there is the next code word at the input of the decoder, it is received and processed, otherwise, the decoding is ended.

Figure 3:
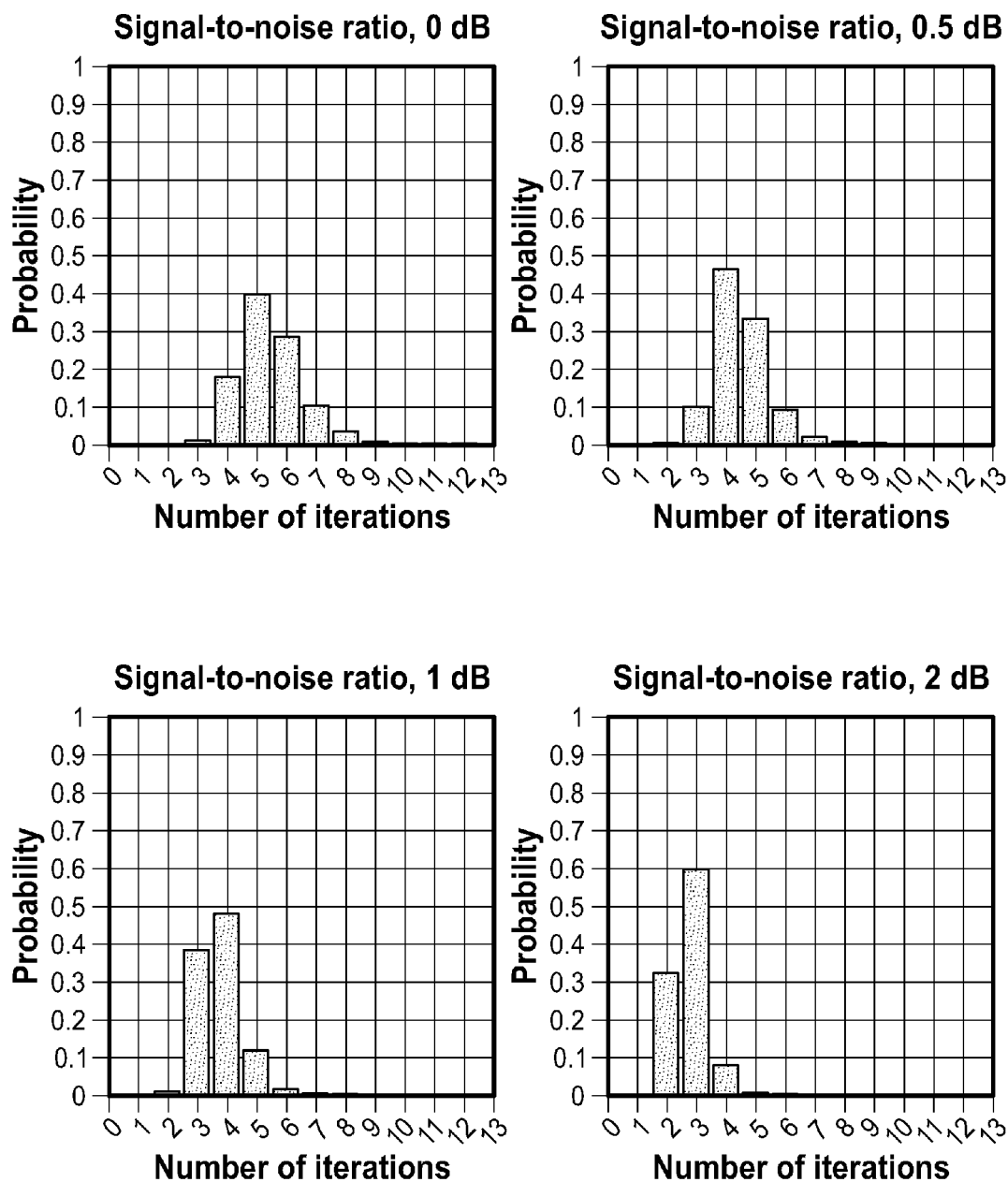
FIG. 3 shows examples of laws of distribution of the number of iterations for various signal-to-noise ratios.
Figure 3:
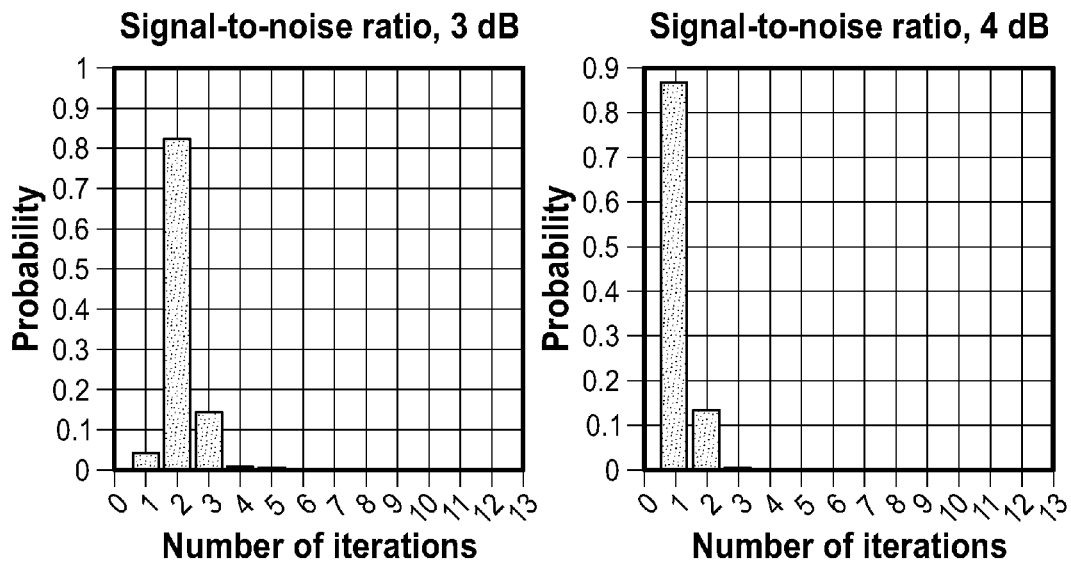

The fourth embodiment of the method for measuring the current signal-to-noise ratio when decoding LDPC codes comprises the following operations: for a specified type of the LDPC decoder, the dependence of the law of distribution of the number of iterations when decoding an input code word on the signal-to-noise ratio is predetermined experimentally or theoretically (FIG. 3 shows examples of these laws of distribution (histograms) for various signal-to-noise ratios).

When decoding each input code word, the number of the iterations performed during decoding is recorded. A histogram of distribution of the number of iterations for a specified time interval is constructed. Based on the comparison of this histogram of distribution of the number of iterations and on the earlier-derived dependences of the average number of iterations when decoding an input code word on the signal-to-noise ratio, an estimate of the current signal-to-noise ratio is derived.

Figure 4:
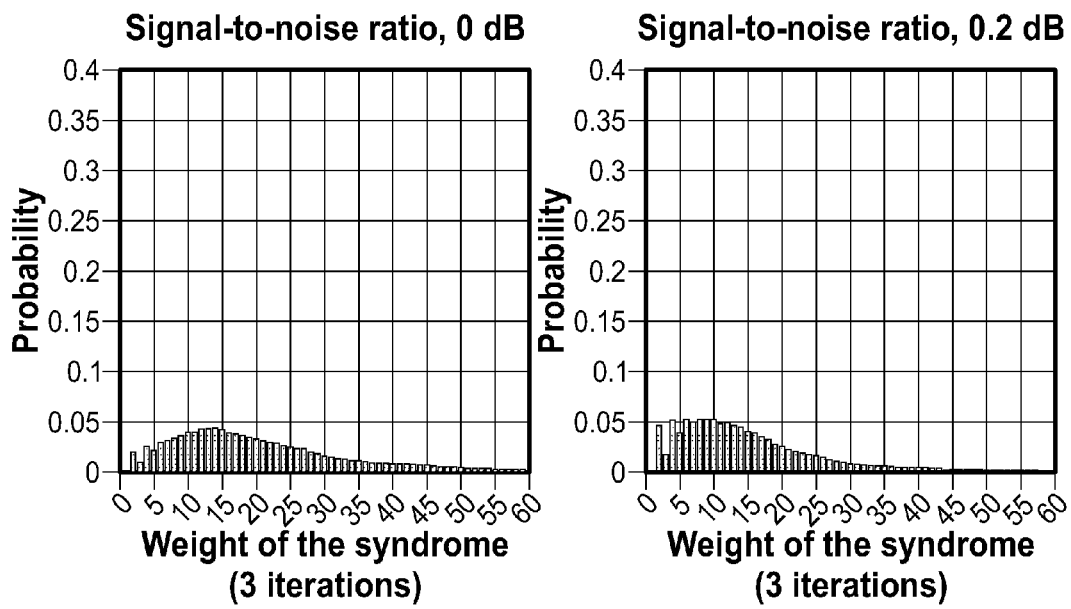
FIG. 4 shows examples of laws of distribution of the weight of the syndrome for various signal-to-noise ratios.
Figure 4:
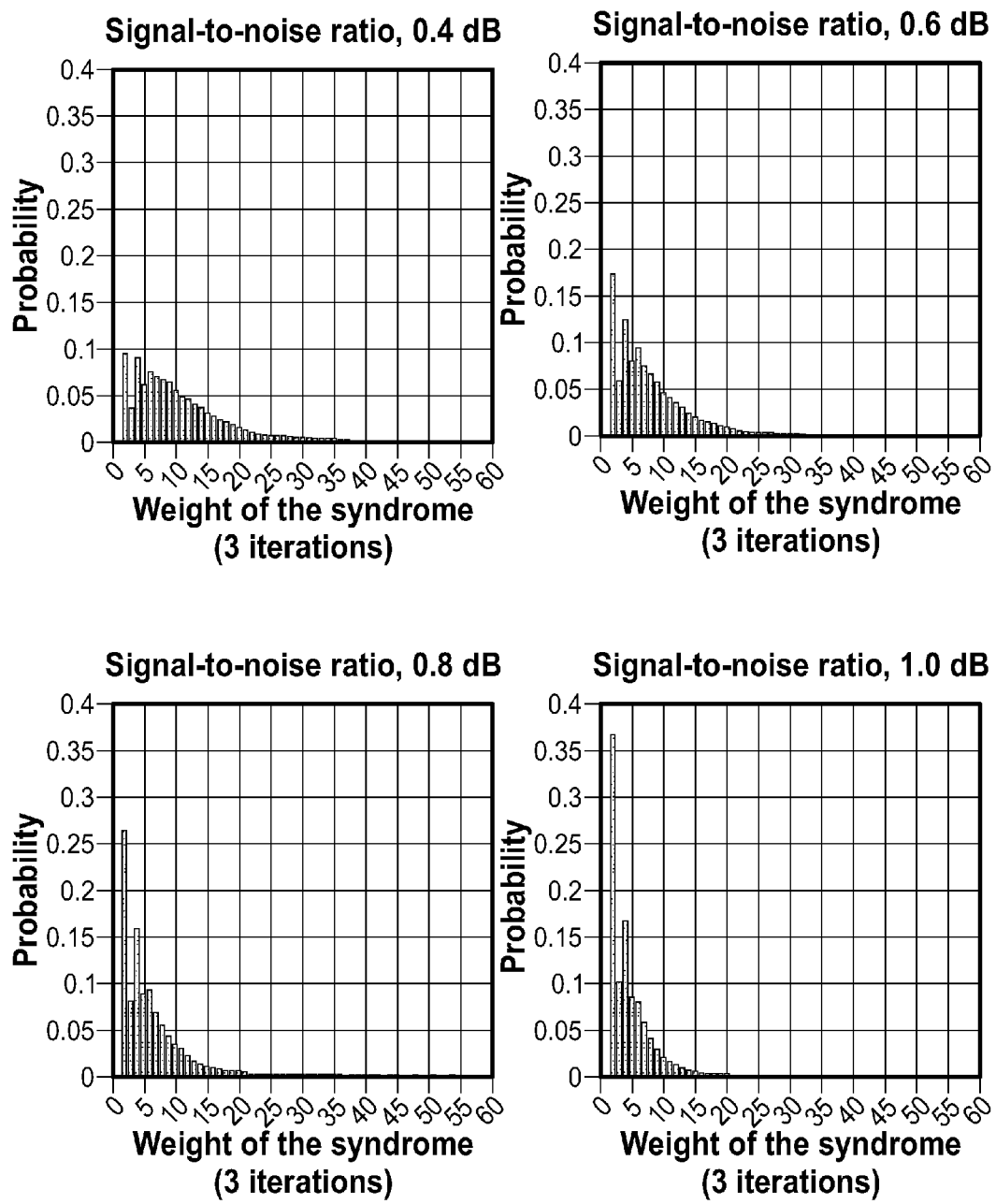

The fifth embodiment of the method for measuring the current signal-to-noise ratio when decoding LDPC codes comprises the following operations: for a specified type of the LDPC decoder, the dependence of the law of distribution of the weight of the syndrome for a specified number of iterations when decoding input code words on the signal-to-noise ratio is predetermined experimentally or theoretically (FIG. 4 shows examples of these laws of distribution (histograms) for various signal-to-noise ratios).

When decoding each input code word for a specified number of the iterations of decoding, the weight of the syndrome is recorded. A histogram of distribution of the weight of the syndrome for each specified number of iterations for a specified time interval is constructed. Based on the comparison of this histogram of distribution of the weight of the syndrome and on the earlier-derived dependence on of the law of distribution of the weight of the syndrome for a specified number of iterations when decoding input code words on the signal-to-noise ratio, an estimate of the current signal-to-noise ratio is derived.

The sixth embodiment of the method for measuring the current signal-to-noise ratio when decoding LDPC codes comprises the following operations: for a specified type of the LDPC decoder, the dependence of the law of distribution of the number of iterations when decoding an input code word on the signal-to-noise ratio, as well as the dependence of the law of distribution of the weight of the syndrome for a specified number of iterations when decoding input code words on the signal-to-noise ratio are predetermined experimentally or theoretically (see FIG. 3 and FIG. 4).

When decoding each input code word, the number of iterations performed during decoding and the weight of the syndrome for the specified number of iterations are recorded. A histogram of distribution of the number of iterations for a specified time interval is constructed. Based on the comparison of this histogram of distribution of the number of iterations and on the earlier-derived dependences of the law of distribution of the number of iterations when decoding an input code word on the signal-to-noise ratio, an estimate of the current signal-to-noise ratio is derived. For each specified number of iterations, a histogram of distribution of the weight of the syndrome for a specified time interval is constructed.

For each specified number of iterations based on the comparison of this histogram of distribution of the weight of the syndrome and on the earlier-derived dependences of the law of distribution of the weight of the syndrome when decoding input code words on the signal-to-noise ratio, an estimate of the current signal-to-noise ratio is derived. Using the signal-to-noise ratio estimates in each measuring channel, the final estimate of the current signal-to-noise ratio is generated, for instance, by weighted summation and normalization.

Figure 5:
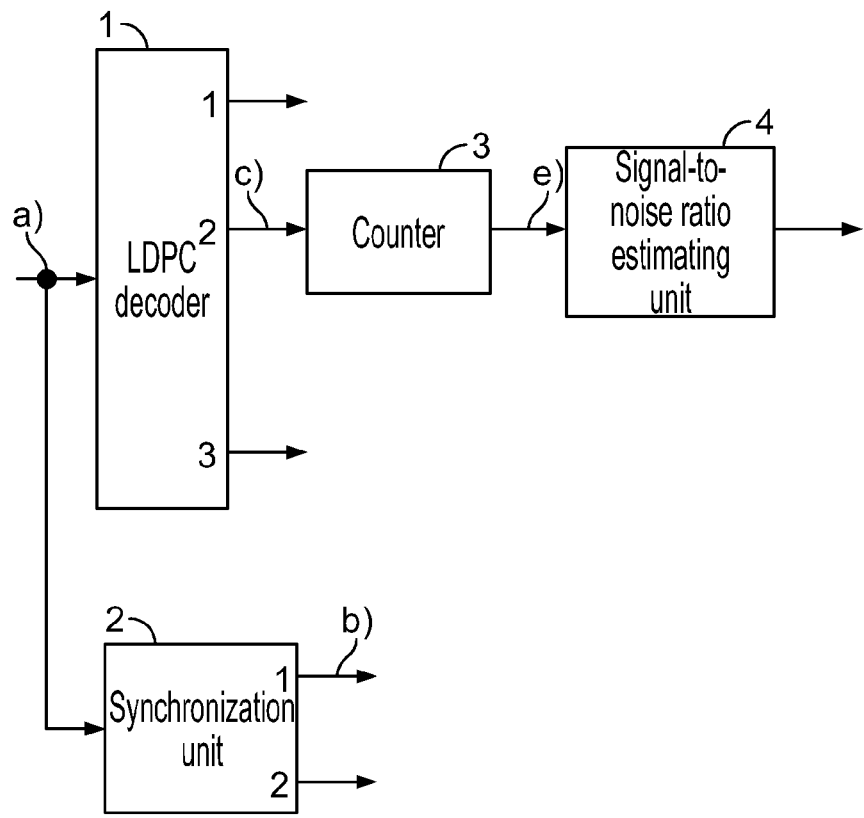
FIG. 5 shows a schematic diagram of the first embodiment of the claimed device.
Figure 14:
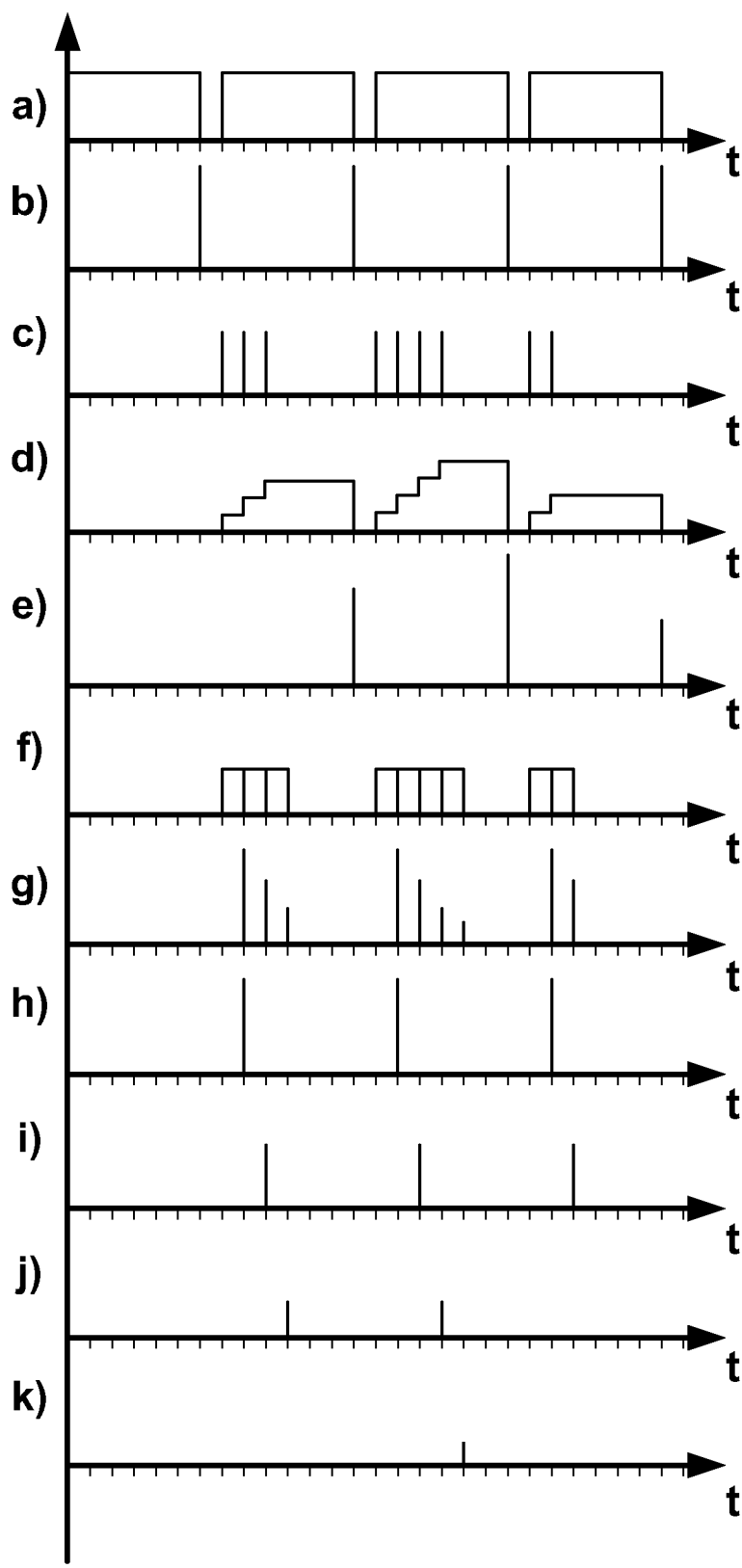
FIG. 14 contains diagrams of signals explaining the principle of operation of the device for measuring the signal-to-noise ratio.

The first embodiment of the device for measuring the current signal-to-noise ratio when decoding LDPC codes is shown in FIG. 5. Diagrams of signals explaining the device functioning are show in FIG. 14 and marked with the corresponding letters. Input code words with "strong" or "weak" solutions, conditionally mapped by signals (a) in FIG. 14, arrive at the input of the LDPC decoder 1 from the output of the demodulator. The synchronization unit 2, based on signals from the demodulator, generates symbolic and word synchronization signals (b) used to control the operation of other units of the device. The LDPC decoder 1 performs decoding of code words, and the result of decoding is transmitted to the output 1 of the LDPC decoder. At the second output of the decoder, a pulse signal (c) is generated during each iteration. Then, this signal arrives at the input of the counter 3, which counts the number of iterations performed by the decoder (d) when decoding each received code word b and generates the output signal (e).

Figure 8:
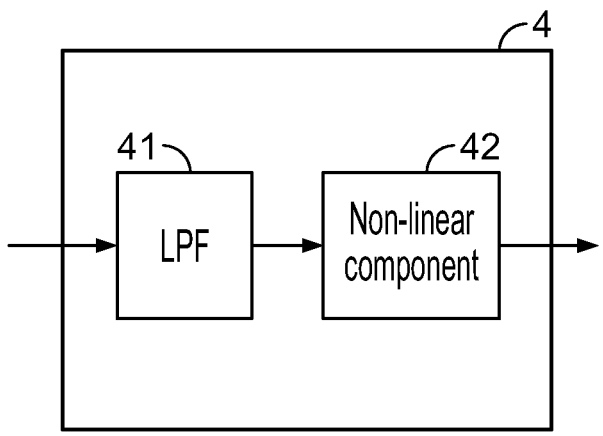
FIG. 8 shows the schematic diagram of the first embodiment of the first signal-to-noise ratio estimating unit.

The information on the number of iterations performed arrives at the signal-to-noise ratio estimating unit 4, which generates the current estimate of the signal-to-noise ratio. This unit can be made, for instance, in the form of the series-connected low-pass filter (LPF) 41 and non-linear component 42 (FIG. 8). The LPF 41 performs the current averaging of the number of iterations for a specified time interval. And the non-linear component 42, having the amplitude characteristic similar to that presented in FIG. 1, performs recalculation of the average number of iterations for the current signal-to-noise ratio.

Figure 9:
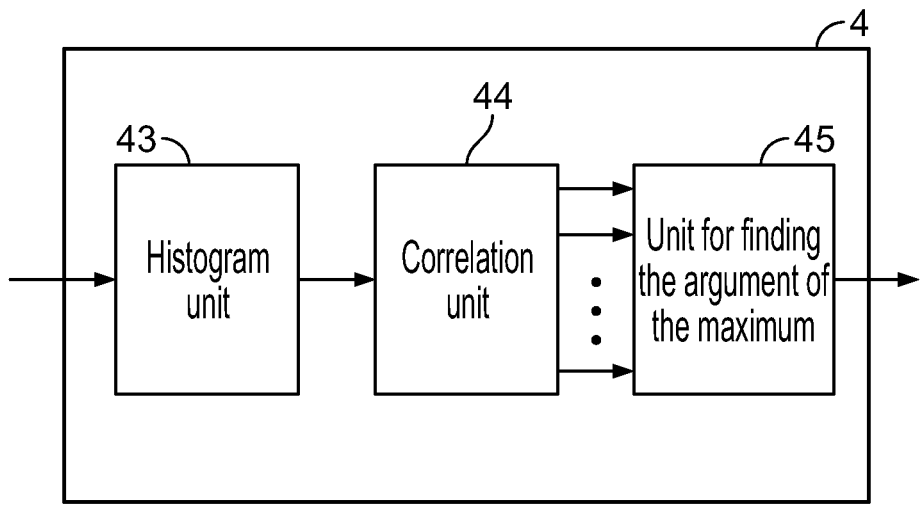
FIG. 9 shows the schematic diagram of the second embodiment of the first signal-to-noise ratio estimating unit.
Figure 10:
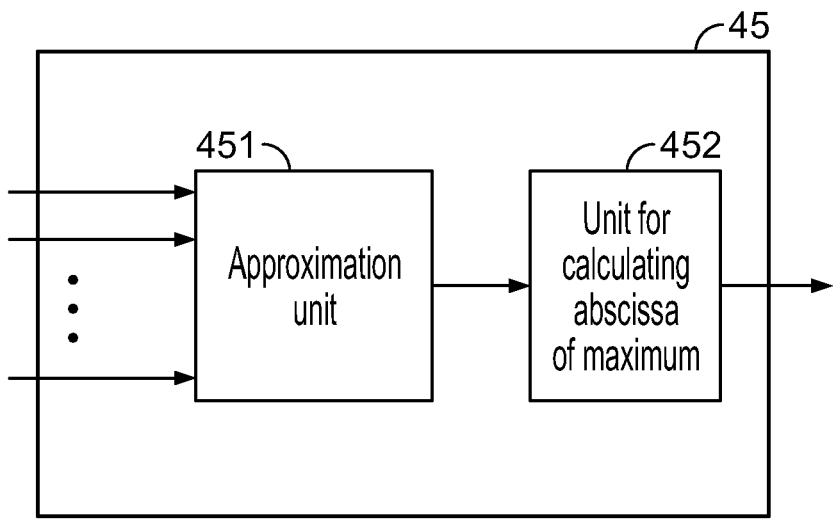
FIG. 10 contains an embodiment of the unit for finding the argument of the maximum.

In addition, the signal-to-noise ratio estimating unit 4 can be made in the form of the series-connected histogram unit 43, correlation unit 44, and the unit for finding the argument of the maximum 45 (FIG. 9). Here, the histogram unit 43, based on processing of the information on the number of iterations performed for each code word, finds the histogram of distribution of the number of executed iterations. The correlation unit 44 calculates the correlation coefficient of the histogram thus obtained, with reference histograms pre-calculated for discrete signal-to-noise ratios. The correlation coefficients derived for each of the discrete values of the signal-to-noise ratio are sent to the unit for finding the argument of the maximum 45, which determines an estimate of the current signal-to-noise ratio using the derived values. This value may be determined by using the criterion of the peak value of the correlation coefficient or based on approximating the derived correlation coefficients in the approximation unit 451 (FIG. 10) and calculating the signal-to-noise ratio corresponding to the maximum of the fitted curve in the unit for calculating the abscissa of the maximum 452.

Figure 6:
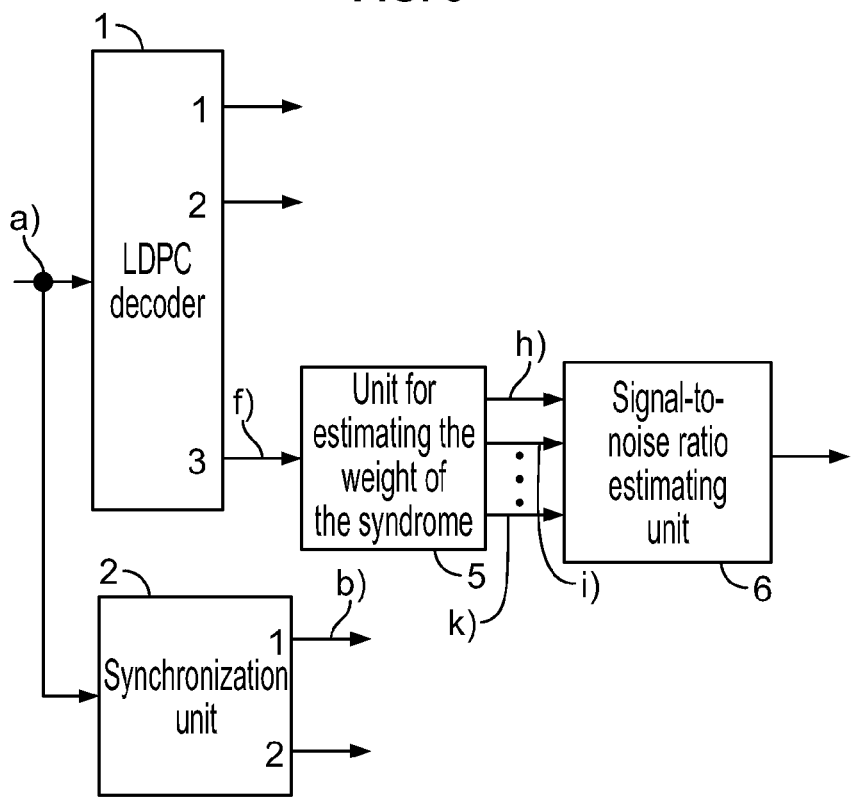
FIG. 6 shows a schematic diagram of the second embodiment of the claimed device.

The second embodiment of the device for measuring the current signal-to-noise ratio when decoding LDPC codes is presented in FIG. 6. The diagrams of signals explaining the functioning of the device are presented in FIG. 14 and are marked with the corresponding letters. Input code words with the "strong" or "weak" solutions conditionally mapped by signals (a) in FIG. 14 arrive at the input of the LDPC decoder 1 from the output of the demodulator. Based on signals from the demodulator, the synchronization unit 2 generates symbolic and word synchronization signals (b) used to control the operation of other units of the device. The LDPC decoder 1 decodes the code words, and the result of decoding is sent to the output of the LDPC decoder 1. The syndrome (f) is generated at the third output of the LDPC decoder 1 during each iteration. Then this signal arrives at the input of the unit for calculating the weight of the syndrome 5 which calculates the number of ones in the syndrome for the specified number of iterations and generates output signals (h, I, k). These signals arrive at the signal-to-noise ratio estimating unit 6.

Figure 11:
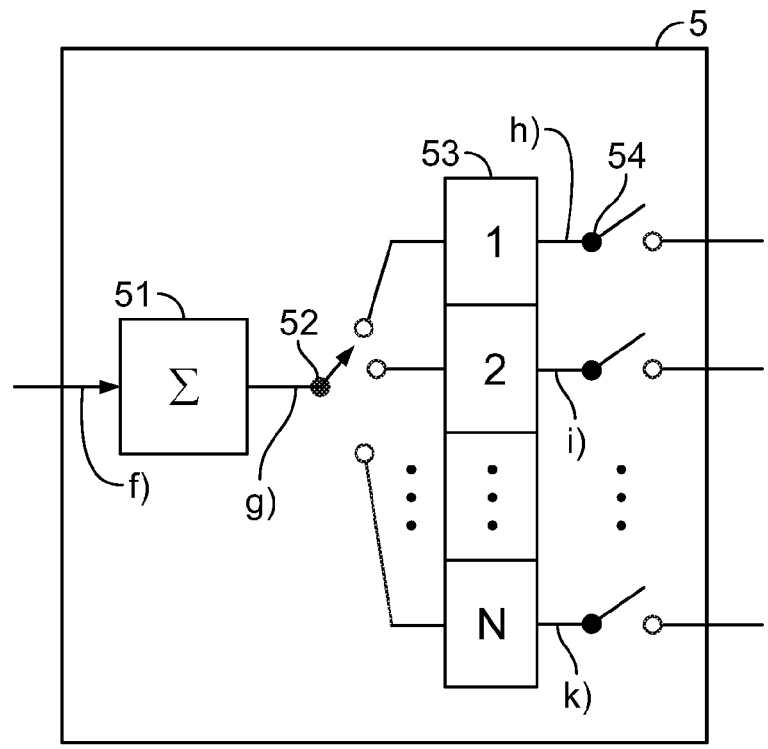
FIG. 11 shows the schematic diagram of the unit for estimating the weight of the syndrome (5).

The unit for estimating the weight of the syndrome 5 can be made (FIG. 11) in the form of the series-connected adder 51, switch 52, unit for storage components 53, and keys unit 54. Here, after the syndrome arrives at the input of the adder 51, the syndrome weight is determined and then it is recorded for each iteration into its own memory element of the unit 53. After performing the necessary number of iterations, the contents of the memory elements is transmitted to the output of the unit for calculating the weight of the syndrome using the keys unit 54. The switch 52 and the keys unit are controlled by signals generated by the synchronization unit 2.

Figure 12:
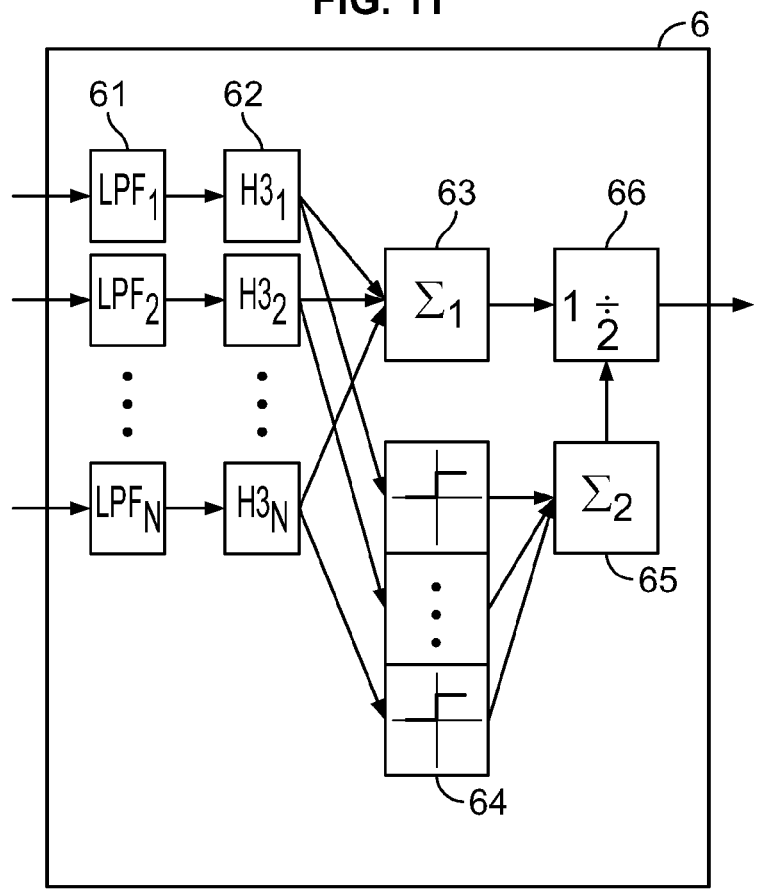
FIG. 12 shows the schematic diagram of the first embodiment of the 2nd signal-to-noise ratio estimating unit (6).

The signal-to-noise ratio estimating unit 6 can be made in the form (FIG. 12) of the series-connected set of low-pass filters 61, set of non-linear components 62, first adder 63 and divider 66, as well as the series-connected set of clippers 64 and second adder 65. Here, the values of the weight of the syndrome for each iteration arrive at the input of the signal-to-noise ratio estimating unit 6, are smoothed out in the corresponding low-pass filters (LPF) 61, and then they are recalculated in the non-linear components (NLC) 62 into an estimate of the signal-to-noise ratio. Then, the derived estimates are averaged. In order to average the derived estimates, the derived estimates are added in the adder 63 and normalized in the divider 66. A number that corresponds to the number of non-zero estimates of the signal-to-noise ratio arrives at the second input of the divider 66. The number is calculated using the clippers 64 and the second adder 65. At the output of each clipper, a unit signal is generated if the input signal is greater than zero, and a zero signal is generated if the input signal is equal to zero. The amplitude characteristics of the non-linear components 62 correspond, for instance, to the dependences shown in FIG. 2 for each specified number of iterations of decoding, respectively.

Figure 13:
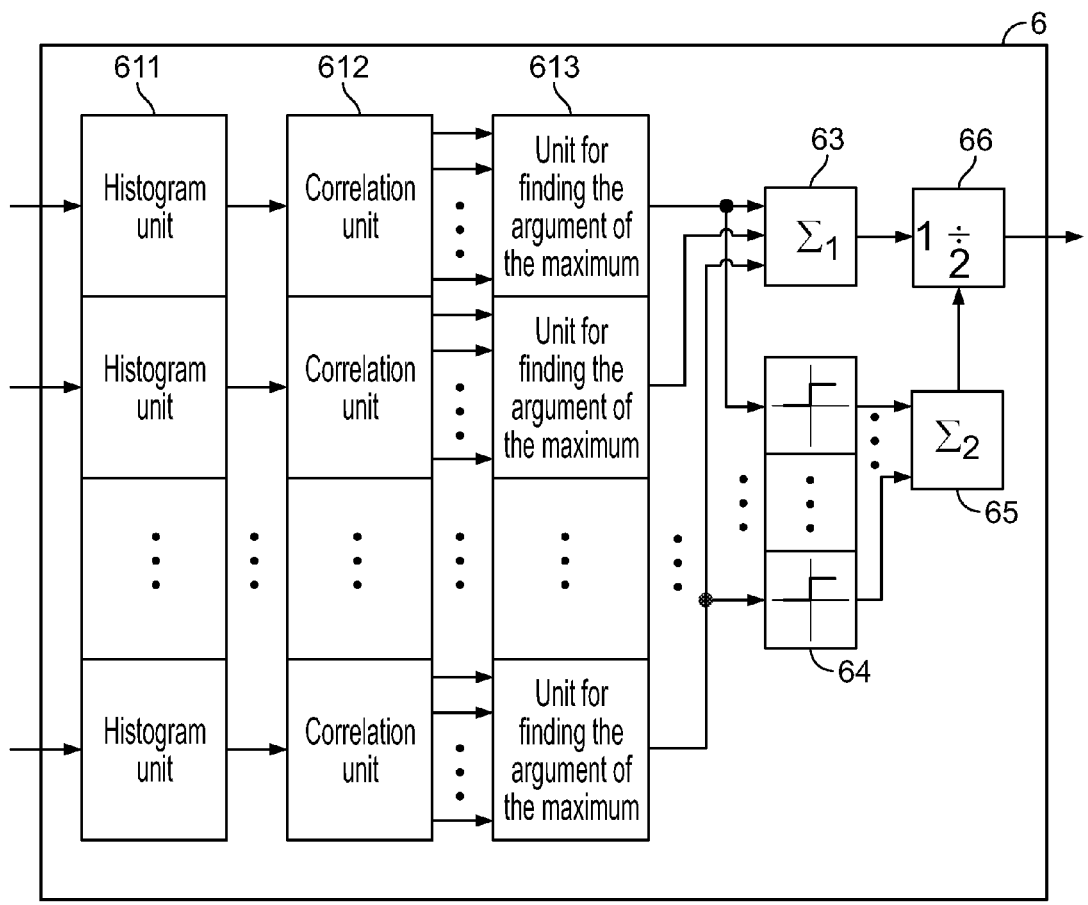
FIG. 13 shows the schematic diagram of the second embodiment of the second signal-to-noise ratio estimating unit (6).

In addition, the signal-to-noise ratio estimating unit 6 can include a serially-connected set of histogram units 611, set of correlation units 612 and set of units for finding the argument of the maximum 613, first adder 63 and divider 66, as well as the series-connected set of clippers 641 and second adder 65 (FIG. 13). Here, based on processing data about the value of the syndrome for a specified number of iterations when decoding each code word, the histogram unit 611 detects the histogram of distribution of the weight of the syndrome for the specified number of iterations. The correlation unit 612 computes the correlation coefficient of the derived histogram with the reference histograms pre-calculated for discrete signal-to-noise ratios and for each of the examined numbers of iterations.

FIG. 4 shows examples of reference histograms of distribution of the weight of the syndrome for three iterations and for various signal-to-noise ratios. The correlation coefficients derived for each discrete value of the signal-to-noise ratio are sent to the unit for finding the argument of the maximum 613, which determines an estimate of the current signal-to-noise ratio using the derived values. This value can be determined using the criterion of the maximum value of the correlation coefficient, or based on an approximating the derived correlation coefficients in the approximation unit 451 (FIG. 10) and calculating the signal-to-noise ratio corresponding to the maximum of the fitted curve in the calculation unit for the abscissa of the maximum 452. Then, the estimates derived for the signal-to-noise ratio are averaged. In order to average the estimates derived for the signal-to-noise ratio, the estimates are added in the adder 63 and normalized in the divider 66. The number corresponding to the number of non-zero estimates of the signal-to-noise ratio arrives at the second input of the divider 66 and is calculated using the clipper unit 64 and the second adder 65. At the output of each clipper, a unit signal generated if the input signal is greater than zero, and a zero signal generated if the input signal is equal to zero.

Figure 7:
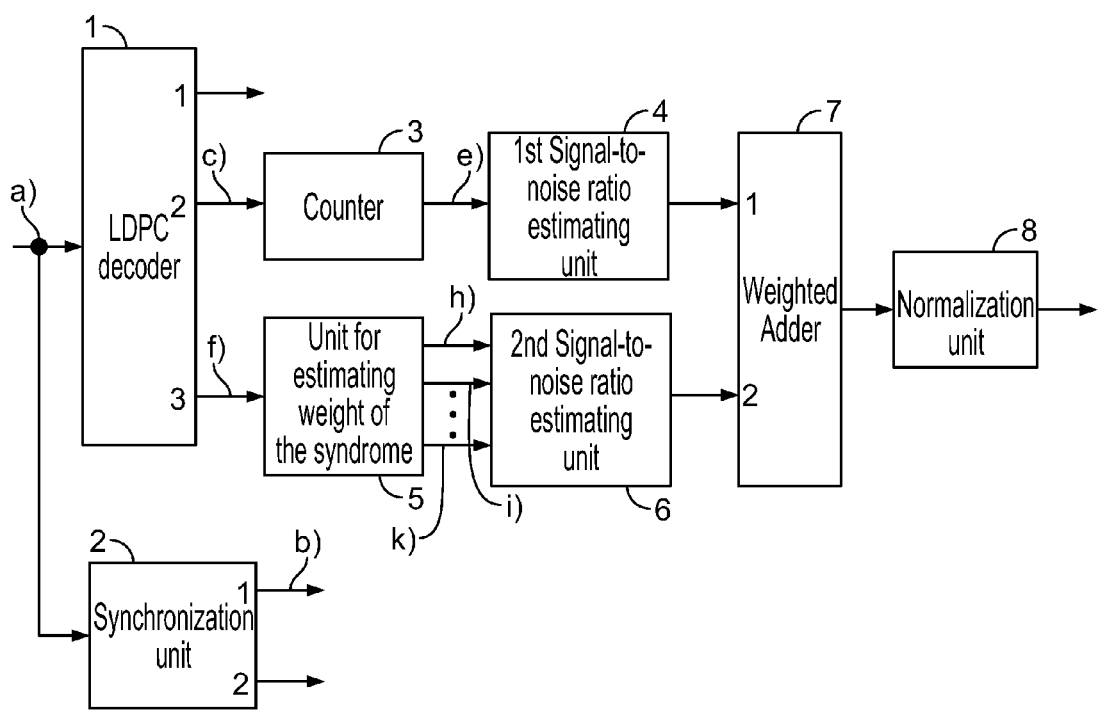
FIG. 7 shows a schematic diagram of the third embodiment of the claimed device.

The third embodiment of the device for measuring the current signal-to-noise ratio when decoding LDPC codes is presented in FIG. 7. The diagrams of the signals explaining the functioning of the device are presented in FIG. 14 and marked with corresponding letters. Input code words from the output of the demodulator with "strong" or "weak" solutions, conditionally marked with the signals (a) in FIG. 14 arrive at the input of the LDPC decoder 1. Based on signals from the demodulator, the synchronization unit 2 generates symbolic and word synchronization signals (b) used to control the operation of other units of the device. The LDPC decoder 1 decodes code words, and the result of decoding is sent to the output of the LDPC decoder 1.

A pulse signal (c) is generated at the second output of the decoder during each iteration. Then, this signal arrives at the input of the counter 3, which calculates the number of iterations performed by the decoder (d) when decoding each received code word b, and generates an output signal (e). This signal arrives at the input of the first signal-to-noise ratio estimating unit 4.

The syndrome (f) is generated at the third output of the LDPC decoder 1 during each iteration. Then, this signal arrives at the input of the unit for calculating the weight of the syndrome 5, which calculates the number of ones in the syndrome for the specified number of iterations and generates output signals (h, I, k). These signals arrive at the second signal-to-noise ratio estimating unit 6.

The principle of functioning and possible embodiments of the signal-to-noise ratio estimating units 4 and 6 are similar to those examined earlier for the first and second embodiments of device for measuring the current signal-to-noise ratio.

Output signals of the first and second signal-to-noise ratio estimating units 4 and 6 are averaged. To do this, they arrive at the weighted adder 7 and then at the normalization unit 8, which perform weighted addition and normalization of estimates of the signal-to-noise ratio in each channel (taking into account the accuracy of the estimates). When the accuracy of the derived estimates is the same, they are added and divided by two.

The invention claimed is:

1. A method for measuring a signal-to-noise ratio when decoding Low Density Parity Check (LDPC) codes, the method comprising:
   receiving from an input of a demodulator an input code word;
   decoding the input code word in a LDPC decoder using a predetermined dependence of a mean number of iterations on the signal-to-noise ratio;
   recording a number of iterations performed during the decoding of the input code word;
   averaging derived values of the number of iterations for a specified time interval;
   estimating a signal-to-noise ratio based on averaged derived values of the number of iterations and based on the predetermined dependence of the mean number of iterations on the signal-to-noise ratio; and
   generating an output decoded code word.

2. A method for measuring the current signal-to-noise ratio when decoding Low Density Parity Check (LDPC) codes, the method comprising:
   receiving from an output of a demodulator an input code word;
   decoding the input code word in a LDPC decoder using a predetermined dependence of a law of distribution of a number of iterations on the signal-to-noise;
   recording a number of iterations performed during the decoding of the input code word;
   constructing a histogram of distribution of the number of iterations for a specified time interval;
   estimating a signal-to-noise ratio based on comparison of the histogram of distribution of the number of iterations and the predetermined dependence of the law of distribution of the number of iterations performed during the decoding of the input code word; and
   generating an output decoded code word.

3. A device for measuring the current signal-to-noise ratio when decoding Low Density Parity Check (LDPC) codes, the device comprising:
- an LDPC decoder;
- an input of the device;
- a first output of the device;
- a signal-to-noise ratio estimating unit;
- a second output of the device;
- a synchronization unit having an input and a plurality of outputs, wherein the input is connected to the input of the device and the plurality of outputs are used to synchronize the operation of components of the device; and
- a counter having an input and an output, wherein the input is connected to one of outputs of the LDPC decoder and the output is connected to an input of the signal-to-noise ratio estimating unit.

4. The device according to claim 3, wherein the signal-to-noise ratio estimating unit is configured in a form of a series-connected low-pass filter and a non-linear component having an amplitude characteristic of an inverse relationship between the mean number of iterations when decoding the input code word and estimating the signal-to-noise ratio for the LDPC decoder.

5. The device according to claim 3, wherein the signal-to-noise ratio estimating unit is configured in a form of a series-connected histogram unit, correlation unit, and a unit for finding the argument of the maximum, wherein the input of the series-connected histogram unit is the input of the signal-to-noise ratio estimating unit, and an output of the unit for finding the argument of the maximum is one of the outputs of the signal-to-noise ratio estimating unit.

6. The device according to claim 5, wherein the unit for finding the argument of the maximum is configured in a form of a series-connected approximation unit and a unit for calculation of the abscissa of the maximum, wherein inputs of the approximation unit are the inputs of the unit for calculation of the abscissa of the maximum, and wherein an output of the unit for calculation of the abscissa of the maximum is an output of the unit for finding the argument of the maximum.

* * * * *

UNITED STATES PATENT AND TRADEMARK OFFICE
CERTIFICATE OF CORRECTION

| | |
|---|---|
| PATENT NO. | : 9,503,219 B2 |
| APPLICATION NO. | : 14/331175 |
| DATED | : November 22, 2016 |
| INVENTOR(S) | : Vazhenin et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 147 days.

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*